United States Patent
Ma

(10) Patent No.: US 7,957,147 B2
(45) Date of Patent: Jun. 7, 2011

(54) ELECTRONIC DEVICE WITH CIRCUIT BOARD SUPPORT

(75) Inventor: Liang-Chun Ma, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 146 days.

(21) Appl. No.: 12/422,293

(22) Filed: Apr. 13, 2009

(65) Prior Publication Data
US 2010/0053902 A1 Mar. 4, 2010

(30) Foreign Application Priority Data
Sep. 1, 2008 (CN) .......................... 2008 1 0304333

(51) Int. Cl.
*H05K 7/20* (2006.01)
(52) U.S. Cl. ........ 361/709; 361/710; 361/717; 361/719; 165/80.3; 165/104.33
(58) Field of Classification Search .................. 361/709, 361/717, 719, 710; 165/80.2, 80.3, 104.33
See application file for complete search history.

(56) References Cited

U.S. PATENT DOCUMENTS

| | | | | |
|---|---|---|---|---|
| 5,738,531 | A * | 4/1998 | Beaman et al. | 439/71 |
| 6,198,630 | B1 * | 3/2001 | Cromwell | 361/704 |
| 6,542,366 | B2 | 4/2003 | Davis et al. | |
| 6,545,879 | B1 * | 4/2003 | Goodwin | 361/807 |
| 6,724,629 | B1 * | 4/2004 | Augustin et al. | 361/704 |
| 6,760,232 | B2 * | 7/2004 | Smith et al. | 361/780 |
| 6,944,025 | B2 * | 9/2005 | Hockanson et al. | 361/719 |
| 6,986,191 | B2 | 1/2006 | White | |
| 7,196,907 | B2 * | 3/2007 | Zheng | 361/760 |
| 7,232,332 | B2 * | 6/2007 | Osborn et al. | 439/487 |
| 7,301,227 | B1 * | 11/2007 | Gektin et al. | 257/680 |
| 7,755,912 | B2 * | 7/2010 | Morita | 361/803 |
| 2004/0252477 | A1 * | 12/2004 | Brown et al. | 361/830 |
| 2005/0117306 | A1 * | 6/2005 | Lee et al. | 361/719 |
| 2005/0135064 | A1 * | 6/2005 | Chen et al. | 361/702 |
| 2005/0152119 | A1 * | 7/2005 | Lee et al. | 361/710 |
| 2006/0007659 | A1 * | 1/2006 | Lee et al. | 361/704 |
| 2008/0068817 | A1 * | 3/2008 | Morita | 361/767 |
| 2008/0165501 | A1 * | 7/2008 | Stewart et al. | 361/704 |
| 2008/0174952 | A1 * | 7/2008 | Ye et al. | 361/687 |
| 2009/0091905 | A1 * | 4/2009 | Kearns et al. | 361/769 |
| 2010/0008048 | A1 * | 1/2010 | Urai | 361/717 |
| 2010/0226102 | A1 * | 9/2010 | So et al. | 361/748 |

FOREIGN PATENT DOCUMENTS

JP 2003229687 A * 8/2003

\* cited by examiner

*Primary Examiner* — Anatoly Vortman
(74) *Attorney, Agent, or Firm* — Frank R. Niranjan

(57) ABSTRACT

An electronic device includes a circuit board comprising a first surface and a second surface, a heat sink positioned on the first surface, and a support positioned on the second surface to support the circuit board. The circuit board includes a pair of first locating holes extending through the first surface and the second surface. The heat sink includes a pair of second locating holes corresponding to the first locating holes. The support includes a pair of locating posts projecting from a pair of diagonal corners thereof and extending through the corresponding first and second locating holes to limit unwanted movement of the heat sink and a shim projecting from a center thereof to prevent the circuit board from flexing. Dimensions of the shim are contoured to provide compensation for bending of the support under an applied load.

15 Claims, 2 Drawing Sheets

ELECTRONIC DEVICE WITH CIRCUIT BOARD SUPPORT

BACKGROUND

1. Technical Field

The present disclosure generally relates to electronic devices, and more particularly to an electronic device with a circuit board support.

2. Description of Related Art

Electronic devices, such as desktop computers, servers, Internet appliances, and the like, frequently encounter physical and mechanical conditions under which a circuit board therein may flex, resulting in damage to the device. This potential for damage is of great concern when, for example, the electronic device is shipped, moved, or undergoes other transportation methods. Furthermore, such movement can cause shock and vibration to components included and attached to the circuit board, resulting in broken contacts, chips, and the like.

Moreover, heat generated by processors of the devices is an additional concern, against which heat sinks are often effective. Commensurate with increases in heat, however, comes a requirement for increasing size and weight of the heat sink. Likelihood of damage to the circuit board increases correspondingly when the heat sink is attached directly thereto, since jarring of the electronic device combined with the bulk of the heat sink can seriously over-flex the circuit board.

Therefore, it is desirable to provide a circuit board support to alleviate the described limitations.

DETAILED DESCRIPTION

Figure 1:
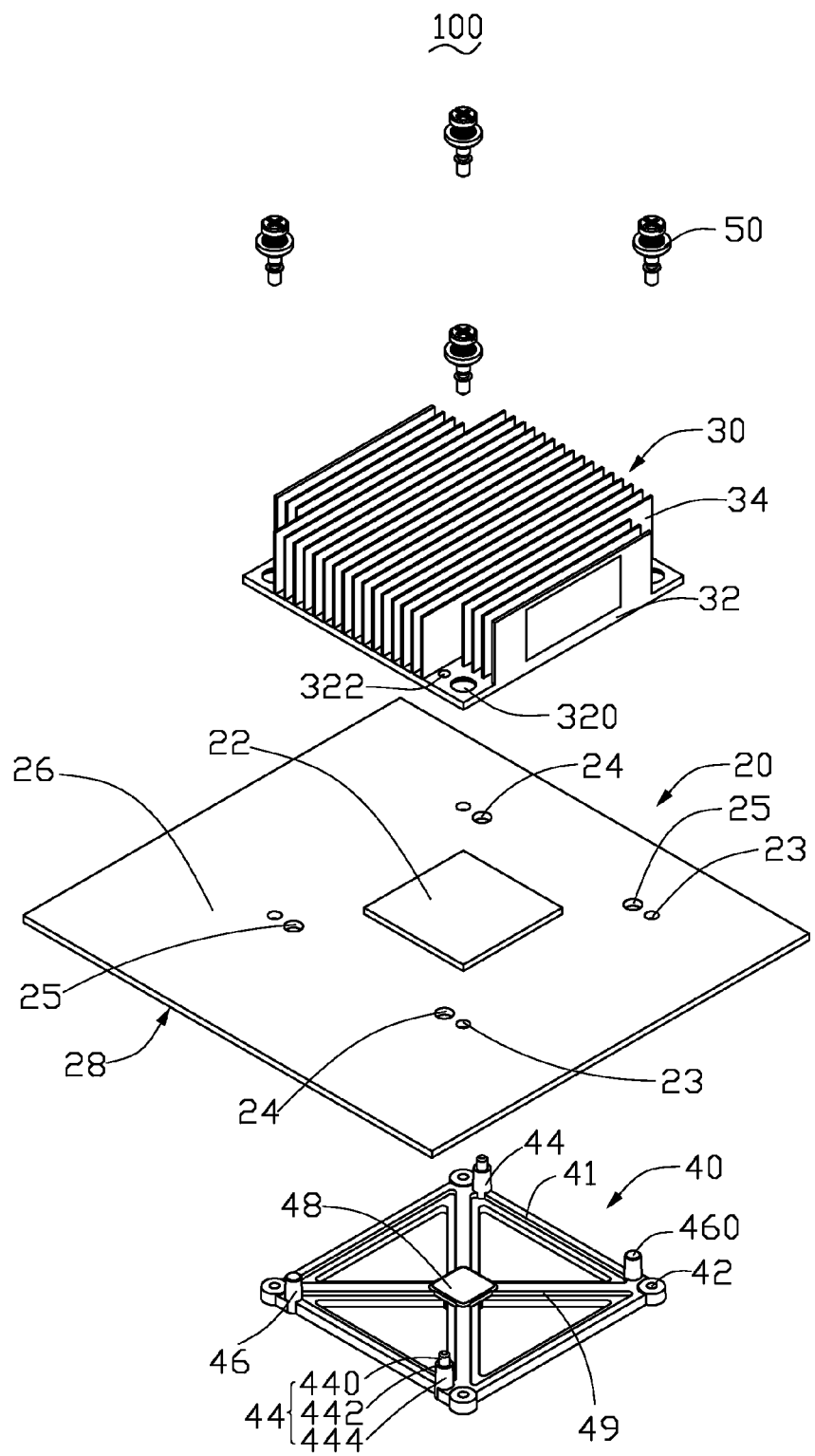
FIG. 1 is an exploded, isometric view of an electronic device of an exemplary embodiment of the disclosure.

FIG. 1 is an exploded, isometric view of an electronic device 100 of an exemplary embodiment of the present disclosure. The electronic device 100 includes a circuit board 20, a heat sink 30, and a support 40. The electronic device 100 may be a desktop computer, a server, an Internet appliance, a digital information appliance, for example, but the disclosure is not limited thereto.

The circuit board 20 includes an integrated circuit 22, such as a processor, for example, which, in operation, generates an undesirable quantity of heat. The heat sink 30 is disposed on a surface of the integrated circuit 22 to absorb and dissipate heat to prevent the integrated circuit 22 from overheating.

The circuit board 20 further includes a pair of first locating holes 24, a plurality of first through holes 23, a pair of receiving holes 25, a first surface 26 and a second surface 28 opposite to the first surface 26. The pair of receiving holes 25 and the pair of first locating holes 24 extend through the first surface 26 and the second surface 28 and are positioned diagonally around the integrated circuit 22. The integrated circuit 22 is mounted on the first surface 26 of the circuit board 20, and the support 40 is disposed on the second surface 28 of the circuit board 20. In the illustrated embodiment, four first through holes 23 are positioned diagonally around the integrated circuit 22 and extend through the first surface 26 and the second surface 28.

The heat sink 30 is preferably formed of heat conductive material, such as metal, and includes a main body 32 and a plurality of fins 34 extending upward from the main body 32 to assist in dissipating heat to the surrounding environment. The main body 32 defines a plurality of second through holes 320 corresponding to the plurality of first through holes 23 of the circuit board 20 and a pair of second locating holes 322 corresponding to the pair of first locating holes 24 of the circuit board 20. A diameter of each of the pair of first locating holes 24 is greater than a diameter of each of the pair of second locating holes 322.

The support 40 limits movement of heat sink 30 to avoid damage to the circuit board 20 and components thereon during shipping, mobile use, for example. The heat sink 30 disposed on the first surface 26 of the circuit board 20 is attached to the support 40 disposed on the second surface 28 of the circuit board 20. The heat sink 30 may be attached to the support 40 by screws, rivets, or other fastener known in the art. As shown here, the support 40 is configured to extend equal to, slightly less than, or beyond the heat sink 30 along the circuit board 20.

The support 40 may be cast of molten metal to conserve parts costs, in one example. The support 40 includes a frame 41 and a pair of rib portions 49 each mechanically connecting two pairs of diagonal corners of the frame 41, creating four spaced areas in the support 40 to reduce weight thereof. Alternatively, three, four, or more rib portions 49 can be utilized. It may be understood that the support 40 may be formed using other techniques by those of ordinary skill in the art.

The frame 41 includes a plurality of threaded holes 42 corresponding to the first through holes 23 and the second through holes 320 and extending through the four diagonal corners thereof, a pair of locating posts 44 generally projecting from one pair of diagonal corners thereof and adjacent to the corresponding threaded holes 42, and a pair of supporting posts 46 generally projecting from the other pair of diagonal corners and adjacent to the corresponding threaded holes 42.

The pair of locating posts 44 are received through the pair of second locating holes 322 through the pair of first locating holes 24 to limit movement of the heat sink 30 as may be encountered during shipping, mobile use, or other transport. Each of the locating posts 44 includes a head portion 440, a step portion 442, and a bottom portion 444. A diameter of the head portion 440 is less than a diameter of the bottom portion 444 to form the step portion 442 between the head portion 440 and the bottom portion 444. The bottom portion 444 passes through and is received in the corresponding first locating hole 24, and the head portion 440 is received in the corresponding second locating hole 322, to support and limit movement of the heat sink 30. The step portion 442 of each of the pair of locating posts 44 and a top plane 460 of each of the pair of supporting posts 46 are coplanar to support the heat sink 30 when attached to the support 40. The support 40 bolsters the heat sink 30 against the circuit board 20 limiting flexing of the circuit board 20 and components included thereon.

A plurality of fastener assemblies 50 such as, for example, screws, are received in the corresponding threaded holes 42 through the corresponding the first through holes 23 and the second through holes 320 to mechanically connect the heat sink 30, the circuit board 20, and the support 40. Although the use of fastener assemblies 50 is discussed, it should be apparent that a wide variety of attachment methods and apparatus are contemplated by the present disclosure without departing from the spirit and scope thereof. As shown here, each of the fastener assemblies 50 includes a spring, a plurality of gaskets, and a screw, resulting in secure and immobilized assembly of the circuit board 20, the heat sink 30, and the support 40.

The support 40 further includes a shim 48 projecting from a junction of the pair of rib portions 49 to brace the circuit board 20 from flexing. In other words, the shim 48 is located in a center of the support 40 and extends above a plane formed by the frame 41 and the pair of rib portions 49. The shim 48 may have any geometrical shape, such as a square, disk, ovaloid shape or rectangular shape.

Figure 2:
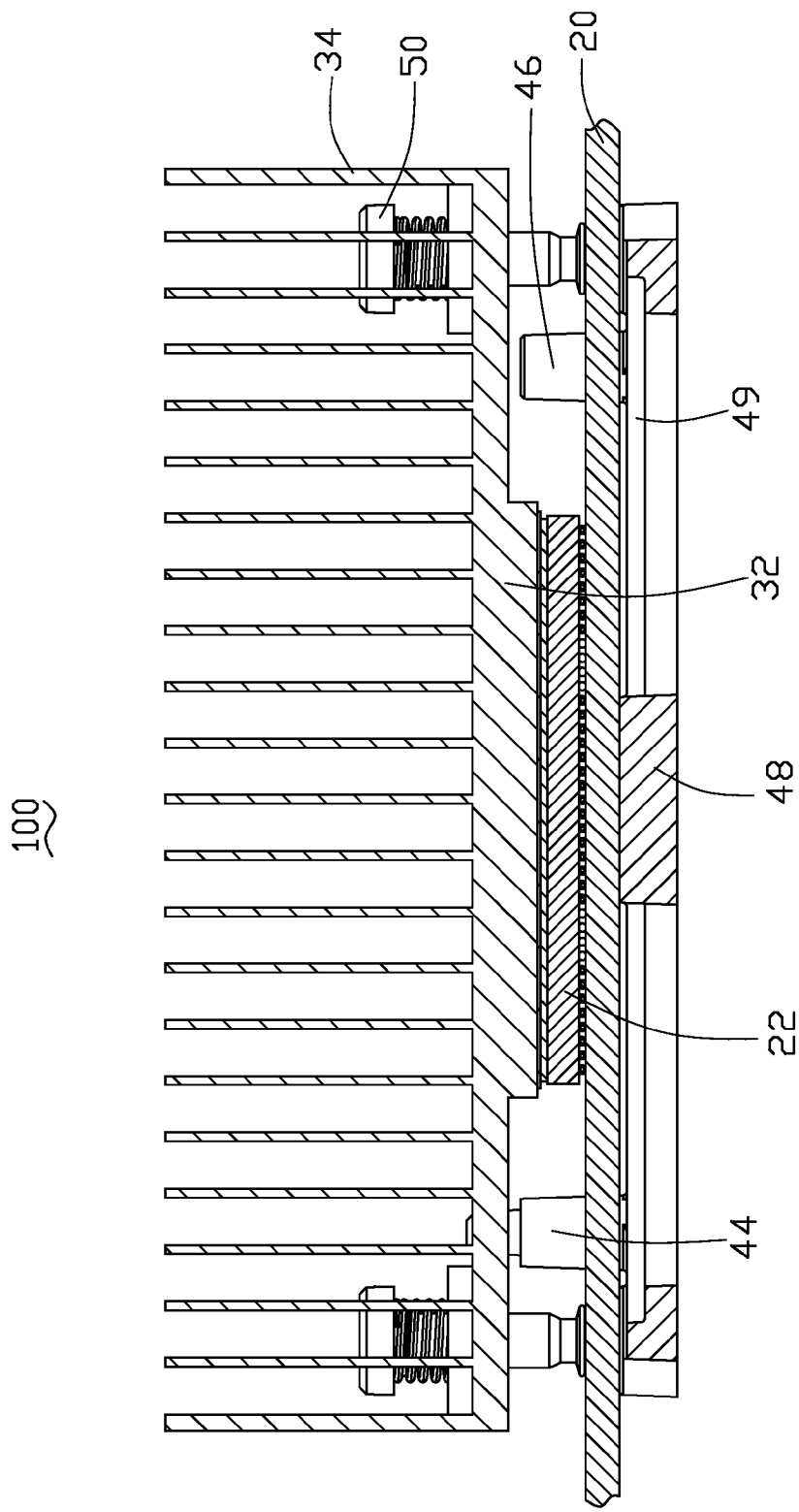
FIG. 2 is an assembled, cross-sectional view of FIG. 1.

Referring to FIGS. 1-2, in assembly, the pair of locating posts 44 of the support 40 extend through the corresponding first locating holes 24 and second locating holes 322. The pair of supporting posts 46 extend through the corresponding receiving holes 25. The plurality of fastener assemblies 50 are fixed in the corresponding threaded holes 42 through the corresponding the second through holes 320 and the first through holes 23, securely mounting the heat sink 30, the circuit board 20, and the support 40 onto the electronic device 100.

In practical application, the support 40 would be bent when the heat sink 30 is attached to the support 40 through the circuit board 20 so that the four corners of the support 40 flex upward and the center of the support 40 spaces from a bottom of the second surface 28 of circuit board 20. In this way, the shim 48 fills the space between the bottom of the second surface 28 of the circuit board 20 and the frame 41, thereby limiting flex of the circuit board 20 and avoiding damage thereto.

In the illustrated embodiment, dimensions of the shim 48 are contoured to compensate bending of the support 40 under an applied load. While the dimensions of the shim 48 may be determined by trial and error, a much preferred manner of determining the shim 48 dimensions is to calculate, e.g., through finite element mathematical modeling, the predetermined dimensions that are operable to compensate for bending of the support 40 under an applied load. The term "finite element modeling" is hereby defined to include both finite analysis and finite difference modeling techniques. In other words, the predetermined dimensions of the shim 48 are provided according to a process of finite element modeling of bending characteristics of the support 40 under the applied load.

In addition, the heat sink 30 bends when the heat sink 30 is attached to the support 40 through the circuit board 20 so that the four corners of the heat sink 30 flex downward. In this position, the pair of locating posts 44 and the pair of supporting posts 46 support and limit movement of the heat sink 30.

Forming the support 40 from metal allows the support 40 to act as a cooling device for the components on the circuit board 20. For example, heat can be conducted from the heat sink 30 through conductive fasteners, such as screws and the like, to the support 40. Additionally, the support 40 may engage with a chassis (not shown) of the electronic device 100 to further conduct heat away from the components on the circuit board 20 to the chassis.

While an embodiment of the present disclosure has been described, it should be understood that it has been presented by way of example only and not by way of limitation. Thus the breadth and scope of the present disclosure should not be limited by the above-described exemplary embodiments, but should be defined only in accordance with the following claims and their equivalents.

What is claimed is:

1. An electronic device comprising:
   a circuit board comprising a first surface, a second surface opposite to the first surface, a pair of first locating holes and a pair of receiving holes extending through the first surface and the second surface;
   a heat sink positioned on the first surface, the heat sink comprising a pair of second locating holes corresponding to the pair of first locating holes; and
   a support positioned on the second surface of the circuit board to support the circuit board, the support comprising a pair of locating posts projecting from a pair of diagonal corners of the support, a pair of supporting posts projecting from the other pair of diagonal corners, and a shim projecting from a center of the support to prevent the circuit board from flexing, wherein the pair of locating posts extend through the corresponding first and second locating holes, and the pair of supporting posts extend through the pair of receiving holes, both to support and limit movement of the heat sink;
   wherein dimensions of the shim are contoured to provide compensation for bending of the support under an applied load.

2. The electronic device as recited in claim 1, wherein each of the pair of locating posts comprises a head portion, a step portion, and a bottom portion, wherein the step portions and top planes of the pair of supporting posts are coplanar.

3. The electronic device as recited in claim 2, wherein a diameter of the head portion is less than that of the bottom portion.

4. The electronic device as recited in claim 1, wherein the support comprises a frame and a pair of rib portions mechanically connecting diagonal corners of the frame.

5. The electronic device as recited in claim 4, wherein the support comprises a plurality of spaced areas between the frame and the pair of rib portions.

6. An electronic device comprising:
   a circuit board comprising a first surface, a second surface opposite to the first surface, a pair of first locating holes and a pair of receiving holes extending through the first surface and the second surface;
   a heat sink positioned on the first surface, the heat sink comprising a pair of second locating holes corresponding to the pair of first locating holes; and
   a support comprising a frame positioned on the second surface of the circuit board, a plurality of rib portions connecting a plurality of pairs of diagonal corners of the frame, a pair of locating posts projecting from one pair of diagonal corners of the frame, a pair of supporting posts projecting from the other pair of diagonal corners and a shim projecting from a junction of the plurality of rib portions to brace the circuit board from flexing, wherein the pair of locating posts extend through the corresponding first and second locating holes, and the pair of supporting posts extend through the pair of receiving holes, both to support and limit movement of the heat sink;
   wherein the support is cast of molten metal.

7. The electronic device as recited in claim 6, wherein dimensions of the shim are contoured to provide compensation for bending of the support under an applied load.

8. The electronic device as recited in claim 6, wherein each of the pair of locating posts comprises a head portion, a step portion, and a bottom portion, wherein the step portions and top planes of the pair of supporting posts are coplanar.

9. The electronic device as recited in claim 8, wherein a diameter of the head portion is less than that of the bottom portion.

10. The electronic device as recited in claim 6, wherein a diameter of each of the pair of first locating holes is greater than that of each of the pair of second locating holes.

11. The electronic device as recited in claim 6, wherein the support comprises a plurality of spaced areas between the frame and the plurality of rib portions.

12. An electronic device comprising:
- a circuit board, comprising a first surface and a second surface opposite to the first surface, and defining a pair of first locating holes and a pair of receiving holes extending through the first surface and the second surface on two diagonal corners thereof;
- a heat sink, positioned on the first surface and comprising a pair of second locating holes corresponding to the pair of first locating holes; and
- a support, positioned on the second surface and comprising:
    - a pair of locating posts projecting from a pair of diagonal corners of the support, each of the pair of locating posts comprising a head portion and a bottom portion, a diameter of the head portion less than a diameter of the bottom portion to form a step portion between the head portion and the bottom portion, wherein the bottom portion passes through and is received in the corresponding first locating hole, and the head portion is received in the corresponding second locating hole to support and limit movement of the heat sink;
    - a pair of supporting posts projecting from another pair of diagonal corners of the support and comprising a pair of top planes, wherein each of the pair of top planes and the step portion are coplanar to support the heat sink and limit flexing of the circuit board; and
    - a shim projecting from a center of the support to prevent the circuit board from flexing.

13. The electronic device as recited in claim 12, wherein the support comprises a frame and a pair of rib portions mechanically connecting diagonal corners of the frame.

14. The electronic device as recited in claim 13, wherein the support comprising a plurality of spaced areas between the frame and the pair of rib portions.

15. The electronic device as recited in claim 12, wherein dimensions of the shim are contoured to compensation for bending of the support under an applied load.

\* \* \* \* \*